(12) United States Patent
Yin et al.

(10) Patent No.: US 6,976,160 B1
(45) Date of Patent: Dec. 13, 2005

(54) METHOD AND SYSTEM FOR CONTROLLING DEFAULT VALUES OF FLIP-FLOPS IN PGA/ASIC-BASED DESIGNS

(75) Inventors: Robert Yin, Castro Valley, CA (US); Mehul R. Vashi, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 670 days.

(21) Appl. No.: 10/082,630

(22) Filed: Feb. 22, 2002

(51) Int. Cl.$^7$ .................................................. G06F 1/24
(52) U.S. Cl. ............................. 713/1; 713/2; 713/100; 716/16; 710/10; 710/104; 326/38; 326/40; 326/46
(58) Field of Search ............................... 713/1, 2, 100; 716/16; 710/10, 104; 326/38, 40, 46

(56) References Cited

U.S. PATENT DOCUMENTS

| | | | |
|---|---|---|---|
| 4,758,985 A | 7/1988 | Carter | |
| 4,855,669 A | 8/1989 | Mahoney | |
| 5,072,418 A | 12/1991 | Boutaud et al. | |
| 5,142,625 A | 8/1992 | Nakai | |
| RE34,363 E | 8/1993 | Freeman | |
| 5,261,104 A * | 11/1993 | Bertram et al. | 713/1 |
| 5,274,570 A | 12/1993 | Izumi et al. | |
| 5,305,460 A * | 4/1994 | Kaneko et al. | 711/163 |
| 5,311,114 A | 5/1994 | Sambamurthy et al. | |
| 5,339,262 A | 8/1994 | Rostoker et al. | |
| 5,347,181 A | 9/1994 | Ashby et al. | |
| 5,361,373 A | 11/1994 | Gilson | |
| 5,457,410 A | 10/1995 | Ting | |
| 5,473,267 A | 12/1995 | Stansfield | |
| 5,500,943 A | 3/1996 | Ho et al. | |
| 5,504,738 A | 4/1996 | Sambamurthy et al. | |
| 5,537,601 A | 7/1996 | Kimura et al. | |
| 5,543,640 A | 8/1996 | Sutherland et al. | |
| 5,550,782 A | 8/1996 | Cliff et al. | |
| 5,552,722 A | 9/1996 | Kean | |
| 5,574,930 A | 11/1996 | Halverson, Jr. et al. | |
| 5,574,942 A | 11/1996 | Colwell et al. | |
| 5,581,745 A | 12/1996 | Muraoka | |
| 5,600,845 A | 2/1997 | Gilson | |
| 5,652,904 A | 7/1997 | Trimberger | |
| 5,671,355 A | 9/1997 | Collins | |
| 5,705,938 A | 1/1998 | Kean | |
| 5,732,250 A | 3/1998 | Bates et al. | |
| 5,737,631 A | 4/1998 | Trimberger | |

(Continued)

FOREIGN PATENT DOCUMENTS

EP          0315275 A2    10/1989

(Continued)

OTHER PUBLICATIONS

Cary D. Snyder and Max Baron; "Xilinx's A-to-Z System Platform"; Cahners Microprocessor; The Insider's Guide to Microprocessor Hardware; Microdesign Resources; Feb. 6, 2001; pp. 1-5.

(Continued)

*Primary Examiner*—Rehana Perveen
(74) *Attorney, Agent, or Firm*—Pablo Meles; Justin Liu

(57) ABSTRACT

During a reset condition or prior to system initialization of an FPGA-based system (100), a FPGA (102) can be pre-configured by loading a value from a memory cell (108) into at least one flip-flop (312) of the FPGA, which represents a configuration register for an FPGA memory controller (106). The FPGA memory controller can be configured using the value loaded in the flip-flop. The value loaded into the flip-flop from the memory cell can be a default value previously stored in the memory cell.

17 Claims, 3 Drawing Sheets

U.S. PATENT DOCUMENTS

| | | | |
|---|---|---|---|
| 5,740,404 | A | 4/1998 | Baji |
| 5,742,179 | A | 4/1998 | Sasaki |
| 5,742,180 | A | 4/1998 | DeHon et al. |
| 5,748,979 | A | 5/1998 | Trimberger |
| 5,752,035 | A | 5/1998 | Trimberger |
| 5,760,607 | A | 6/1998 | Leeds et al. |
| 5,768,584 | A * | 6/1998 | MacDonald et al. ........... 713/1 |
| 5,809,517 | A | 9/1998 | Shimura |
| 5,835,405 | A | 11/1998 | Tsui et al. |
| 5,874,834 | A | 2/1999 | New |
| 5,889,788 | A | 3/1999 | Pressly et al. |
| 5,892,961 | A | 4/1999 | Trimberger |
| 5,914,616 | A | 6/1999 | Young et al. |
| 5,914,902 | A | 6/1999 | Lawrence et al. |
| 5,933,023 | A | 8/1999 | Young |
| 5,970,254 | A | 10/1999 | Cooke et al. |
| 6,011,407 | A | 1/2000 | New |
| 6,020,755 | A | 2/2000 | Andrews et al. |
| 6,026,481 | A | 2/2000 | New et al. |
| 6,054,871 | A * | 4/2000 | New ........................... 326/39 |
| 6,096,091 | A | 8/2000 | Hartmann |
| 6,119,192 | A * | 9/2000 | Kao et al. .................... 710/311 |
| 6,154,051 | A | 11/2000 | Nguyen et al. |
| 6,163,166 | A | 12/2000 | Bielby et al. |
| 6,172,990 | B1 | 1/2001 | Deb et al. |
| 6,178,541 | B1 | 1/2001 | Joly et al. |
| 6,181,163 | B1 | 1/2001 | Agrawal et al. |
| 6,211,697 | B1 | 4/2001 | Lien et al. |
| 6,242,945 | B1 | 6/2001 | New |
| 6,272,451 | B1 | 8/2001 | Mason et al. |
| 6,279,045 | B1 | 8/2001 | Muthujumaraswathy et al. |
| 6,282,627 | B1 | 8/2001 | Wong et al. |
| 6,301,696 | B1 | 10/2001 | Lien et al. |
| 6,343,207 | B1 | 1/2002 | Hessel et al. |
| 6,353,331 | B1 | 3/2002 | Shimanek |
| 6,356,987 | B1 | 3/2002 | Aulas |
| 6,381,732 | B1 * | 4/2002 | Burnham et al. ............... 716/8 |
| 6,389,558 | B1 | 5/2002 | Herrmann et al. |
| 6,434,735 | B1 | 8/2002 | Watkins |
| 6,460,172 | B1 | 10/2002 | Insenser Farre et al. |
| 6,467,009 | B1 | 10/2002 | Winegarden et al. |
| 6,483,342 | B2 | 11/2002 | Britton et al. |
| 6,496,971 | B1 * | 12/2002 | Lesea et al. ................... 716/16 |
| 6,507,942 | B1 | 1/2003 | Calderone et al. |
| 6,510,548 | B1 | 1/2003 | Squires |
| 6,518,787 | B1 | 2/2003 | Allegrucci et al. |
| 6,519,753 | B1 | 2/2003 | Ang |
| 6,522,167 | B1 | 2/2003 | Ansari et al. |
| 6,532,572 | B1 | 3/2003 | Tetelbaum |
| 6,539,508 | B1 | 3/2003 | Patrie et al. |
| 6,541,991 | B1 | 4/2003 | Hornchek et al. |
| 6,578,174 | B2 | 6/2003 | Zizzo |
| 6,587,995 | B1 | 7/2003 | Duboc et al. |
| 6,588,006 | B1 | 7/2003 | Watkins |
| 6,601,227 | B1 | 7/2003 | Trimberger |
| 6,604,228 | B1 | 8/2003 | Patel et al. |
| 6,611,951 | B1 | 8/2003 | Tetelbaum et al. |
| 2001/0049813 | A1 | 12/2001 | Chan et al. |
| 2003/0062922 | A1 | 4/2003 | Douglass et al. |

FOREIGN PATENT DOCUMENTS

| | | |
|---|---|---|
| EP | 0 905 906 A2 | 3/1999 |
| EP | 1 235 351 A1 | 8/2002 |
| WO | WO 93 25968 A1 | 12/1993 |

OTHER PUBLICATIONS

Sayfe Kiaei et al., "VLSI Design of Dynamically Reconfigurable Array Processor-Drap," IEEE, Feb. 1989, pp. 2484-2488, V3.6, IEEE, 3 Park Avenue, 17th Floor, New York, NY 10016-5997.

Vason P. Srini, "Field Programmable Gate Array (FPGA) Implementation of Digital Systems: An Alternative to ASIC, " IEEE, May 1991, pp. 309-314, IEEE, 3 Park Avenue, 17th Floor, New York, NY 10016-5997.

G. Maki et al., "A Reconfigurable Data Path Processor," IEEE, Aug. 1991, pp. 18-4.1 to 18-4.4, IEEE, 3 Park Avenue, 17th Floor, New York, NY 10016-5997.

Jacob Davidson, "FPGA Implementation of Reconfigurable Microprocessor," IEEE, Mar. 1993, pp. 3.2.1-3.2.4, IEEE, 3 Park Avenue, 17th Floor, New York, NY 10016-5997.

Christian Iseli et al., "Beyond Superscaler Using FPGA's," IEEE, Ap. 1993, pp. 486-490, IEEE, 3 Park Avenue, 17th Floor, New York, NY 10016-5997.

P.C. French et al., "A Self-Reconfiguring Processor,"; IEEE, Jul. 1993, pp. 50-59, IEEE, 3 Park Avenue, 17th Floor, New York, Ny 10016-5997.

Christian Iseli et al., "SPYDER: A Reconfigurable VLIW Processor Using FPGA's, " IEEE, Jul. 1993, pp. 17-24, IEEE, 3 Park Avenue, 17th Floor, New York, NY 10016-5997.

Micheal I. Wirthlin et al., "The Nano Processor: A Low Resource Reconfigurable Processor,," IEEE, Feb. 1994, pp. 23-30, IEEE, 3 Park Avenue, 17th Floor, New York, NY 10016-5997.

William S. Carter, "The Future of Programmable Logic and Its Impact on Digital System Design," Apr. 1994, IEEE, pp. 10-16, IEEE, 3 Park Avenue, 17th Floor, New York, NY 10016-5997.

Andre' Dehon, "DPGA-Coupled Microprocessors: Commodity ICs for the Early 21st Century," IEEE, Feb. 1994, pp. 31-39, IEEE, 3 Park Avenue, 17th Floor, New York, NY 10016-5997.

Osama T. Albaharna, "Area & Time Limititations of FPGA-Based Virtual Hardware," IEEE, Apr. 1994, pp. 184-189, IEEE, 3 Park Avenue, 17th Floor, New York, NY 10016-5997.

U.S. Appl. No. 10/043,769, filed Jan. 9, 2002, Schulz.

*Xilinx, Inc.,* "The Programmable Logic Data Book," 1994, Revised 1995, Xilinx, Inc., 2100 Logic Drive, San Jose, CA. 95124.

*Xilinx, Inc.,* "The Programmable Logic Data Book," 1994, Revised 1995, pp 2-109 to 2-117, Xilinx, Inc., 2100 Logic Drive, San Jose, CA. 95124.

*Xilinx, Inc.,* "The Programmable Logic Data Book," 1994, Revised 1995, pp 2-9 to 2-18; 2-187 to 2-199, Xilinx, Inc., 2100 Logic Drive, San Jose, CA. 95124.

*Xilinx, Inc.,* "The Programmable Logic Data Book," 1994, Revised 1995, pp 2-107 to 2-108, Xilinx, Inc., 2100 Logic Drive, San Jose, CA. 95124.

Christian Iseli et al., "AC++ Compiler for FPGA Custom Execution Units Synthesis," 1995, pp. 173-179, IEEE, 3 Park Avenue, 17th Floor, New York, NY 10016-5997.

*International Business Machines,* "PowerPC 405 Embedded Processor Core User Manual," 1996, 5th Ed., pp. 1-1 to X-16, International Business Machines, 1580 Rout 52, Bldg. 504, Hopewell Junction, NY 12533-6531.

Yamin Li et al., "Aizup-A Pipelined Processor Design & Implementation on Xilinx FPGA Chip," IEEE, Sep. 1996, pp 98-106, 98-106, IEEE, 3 Park Avenue, 17th Floor, New York, NY 10016-5997.

Ralph D. Wittig et al., ONECHIP: An FPGA Processor with Reconfigurable Logic, Apr. 17, 1996, pp 126-135, IEEE, 3 Park Avenue, 17th Floor, New York, NY 10016-5997.

*Xilinx, Inc.*, "The Programmable Logic Data Book," Jan. 27, 1999, Ch. 3, pp 3-1 to 3-50, Xilinx, Inc., 2100 Logic Drive, San Jose, CA 95124.

William B. Andrew et al., "A Field Programmable System Chip Which Combines FPGA & ASIC Circuitry," IEEE, May 16, 1999, pp. 183-186, IEEE, 3 Park Avenue, 17th Floor, New York, NY 10016-5997.

*Xilinx, Inc.*, "The Programmable Logic Data Book," 2000, Ch. 3 pp 3-1 to 3-117, Xilinx, Inc., 2100 Logic Drive, San Jose, CA 95124.

U.S. Appl. No. 10/001,871, filed Nov. 19, 2001, Douglass et al.

U.S. Appl. No. 09/991,412, filed Nov. 16, 2001, Herron et al.

U.S. Appl. No. 09/991,410, filed Nov. 16, 2001, Herron et al.

U.S. Appl. No. 09/968,446, filed Sep. 28, 2001, Douglass et al.

*Xilinx, Inc.*, "The Programmable Logic Data Book," 2000, Ch 3, pp 3-7 to 3-17; 3-76 to 3-87, Xilinx, Inc., 2100 Logic Drive, San Jose, CA. 95124.

*International Business Machines*, "Processor Local Bus"Architecture Specifications, 32-Bit Implementation, Apr. 2000, First Edition, V2.9, pp. 1-76, IBM Corporation, Department H83A, P.O. Box 12195, Research Triangle Park, NC 27709.

*Xilinx, Inc.*, Virtex II Platform FPGA Handbook, Dec. 6, 2000, v1.1, pp 33-75, Xilinx, Inc., 2100 Logic Drive, San Jose, CA. 95124.

U.S. Appl. No. 09/858,732, filed May 15, 2001, Schulz.

U.S. Appl. No. 09/861,112, filed May 18, 2001, Dao et al.

U.S. Appl. No. 09/917,304, filed Jul. 27, 2001, Douglass et al.

* cited by examiner

METHOD AND SYSTEM FOR CONTROLLING DEFAULT VALUES OF FLIP-FLOPS IN PGA/ASIC-BASED DESIGNS

FIELD OF THE INVENTION

This invention relates generally to programmable logic devices, and more particularly to a method and system for preloading default values in flip-flops (FFs), which can be utilized as configuration registers, in PGA/ASIC-based designs.

BACKGROUND OF THE INVENTION

As chip capacity continues to significantly increase, the use of programmable gate arrays (PGAs), particularly field programmable gate arrays (FPGAs), is quickly replacing the use of application specific integrated circuits (ASICs). An ASIC is a specialized chip that is designed for a particular application. Notably, an FPGA is a programmable logic device (PLD) that has an extremely high density of electronic gates as compared to an ASIC. This high gate density has contributed immensely to the popularity and flexibility of FPGA's. Importantly, FPGAs can be designed using a variety of architectures, which can include user configurable input/output blocks (IOBs) and programmable/configurable logic blocks (PLBs/CLBs) having configurable interconnects and switching capability. The CLBs, IOBs, and interconnect structure are typically programmed by loading a bitstream of configuration data into internal configuration memory cells that define how the CLBs, IOBs, and interconnect structure are configured. The configuration bitstream is typically loaded from an external memory, for example, from and an external programmable read only memory (PROM) or similar device. The collective states of the individual memory cells determine the functions of the FPGA.

As advancements in computer chip technology continue to increase the threshold on the number of CLBs, IOBs and interconnect structure in FPGAs, it has become possible to build entire data processing systems inside the FPGA. These processing systems are typically called embedded processors or controllers. An embedded processor or controller can be microprocessor or microcontroller circuitry that has been integrated into an electronic device, such as an FPGA, as opposed to being built as a standalone module or "plugin card." Moreover, advancements in FPGA technology has also led to the development of FPGA-based system-on-chip (SoC), including FPGA-based embedded processor SoCs. A SoC is a fully functional product having its electronic circuitry contained on a single chip. While a microprocessor chip requires ancillary hardware electronic components to process instructions, a SoC can include all required ancillary electronics. For example, a SoC for a cellular telephone can include a microprocessor, encoder, decoder, digital signal processor (DSP), RAM and ROM. FPGA-based SoCs with embedded operating systems (OSs) have further enhanced their popularity and flexibility.

FPGA-based SoCs have resulted in the proliferation of numerous consumer devices such as wireless telephones, personal digital assistants (PDAs), and digital cameras. In order for device manufacturers to develop FPGA-based SoCs, it is necessary for them to acquire intellectual property rights for system components and/or related technologies that are utilized to create the FPGA-based SoCs. These system components and/or technologies are called cores or IP cores. An electronic file containing component information can typically be used to represent the core. A device manufacturer will generally acquire rights for one or more IP cores that are integrated to fabricate the SoC.

One of the most important resources in data processing systems including consumer devices is memory. Many FPGAs provide blocks of random access memories (RAMs), each having thousands of memory cells (called "block RAMs" or BRAMS). BRAMS are known in the art. Notwithstanding, the flexibility of the blocks permit a variety of memory configurations. For example, a BRAM having a capacity of 16 Kilobits can be configured to have an address depth of either 16K, 8K, 4K, 2K, 1K and 0.5K, with the corresponding number of bits per address as 1, 2, 4, 8, 16 or 32, respectively. Additionally, a number of blocks can be combined to increase the total memory size. During operation of the FPGA, the BRAMs can be used to store information such as system configuration data, program data, and operational data. For example, configuration information used during initialization of a data processing device can be stored in the BRAM.

The high level structure of an FPGA comprises the FPGA fabric, which can include a processor block, and BRAMs. The processor block can include an IP core surrounded by supporting logic circuitry, known in the art as "gasket logic." Residing within the gasket logic are on-chip memory (OCM) controllers configured to control the flow of data between the BRAMS and the IP core. The OCM controllers typically have control registers which store configuration information, which can be used for initialization and performing particular functions.

One major disadvantage with existing data processing systems and devices that utilize FPGAs is that the on-chip devices such as the OCM controllers have to wait for the system or device to be initialized before the control registers are configured. Generally, the on-chip device control or configuration registers are loaded at runtime, which occurs after the data processing system or device has been powered up and has executed its startup routines. The more extensive the startup routines, the longer it will take to load values in the control registers during system initialization. Consequently, boot and startup times for these data processing systems and devices can be unnecessarily extended.

Given these and other inherent drawbacks, there is a need for a method and system for controlling default value of flip-flops used as configuration registers in PGA/ASIC-based designs.

SUMMARY OF THE INVENTION

A method and system for pre-configuring an FPGA to a known state prior to the FPGA undergoing system initialization or a reset condition of an IP core of the FPGA is shown. The method can include the step of loading a configuration value for an FPGA on-chip device into a flip-flop, which can be coupled to the on-chip device. The configuration value can subsequently be transferred or read from the flip-flop to the on-chip device in order to effectuate pre-configuration of the on-chip device. The configuration value can be pre-stored in an FPGA memory cell, which can be a BRAM memory cell. The configuration value can be transferred from the memory cell to the flip-flop upon power-up of the FPGA or upon a reset condition of the IP core. A transitioning clock signal coupled to the flip-flop can effectuate the transfer of the configuration value from the memory cell to the flip-flop upon power-up of the FPGA (or the reset of the IP core). The transitioning clock signal can also effectuate the transfer or reading of the configuration value from the flip-flop to the on-chip device. The flip-flop can be a D-type flip-flop, which can function as a configuration register for the on-chip device. The on-chip device can be an on-chip memory controller.

In another aspect of the invention, a method for pre-configuring an FPGA prior to system initialization of the FPGA (or during a reset condition of the IP core) comprises pre-configuring the FPGA by loading a configuration value into at least one flip-flop of the FPGA that function as a configuration register for a memory controller of the FPGA. The value in the flip-flop can be used to configure the FPGA to a specified state. Loading the configuration value into the FPGA can be accomplished by transferring a value previously stored in a memory cell of the FPGA to a flip-flop where it can be stored. Whenever the FPGA is powered up (or the IP core receiving a reset signal to reset the internal states of the IP core), the value stored in the flip-flop can be read from the flip-flop in order to effectuate configuration of the on-chip device. The value stored in the memory cell can be a default state of the memory cell.

In yet another aspect of the present invention, a system for pre-configuring an FPGA to a known state prior to the system initialization of the FPGA comprises a flip-flop coupled to an on-chip device of the FPGA and a clock transitioning circuit coupled to the flip-flop. The clock transitioning circuit can cause a configuration value for the on-chip device to be loaded into the flip-flop. The clock transitioning circuit can further cause the configuration value to be read by the on-chip device, thereby effectuating pre-configuration of the on-chip device. The configuration value can be pre-stored in an FPGA BRAM memory cell. Furthermore, the flip-flop can be a D-type flip-flop, which can be configured to operate as a configuration register for the on-chip device.

DETAILED DESCRIPTION OF THE DRAWINGS

Figure 1:
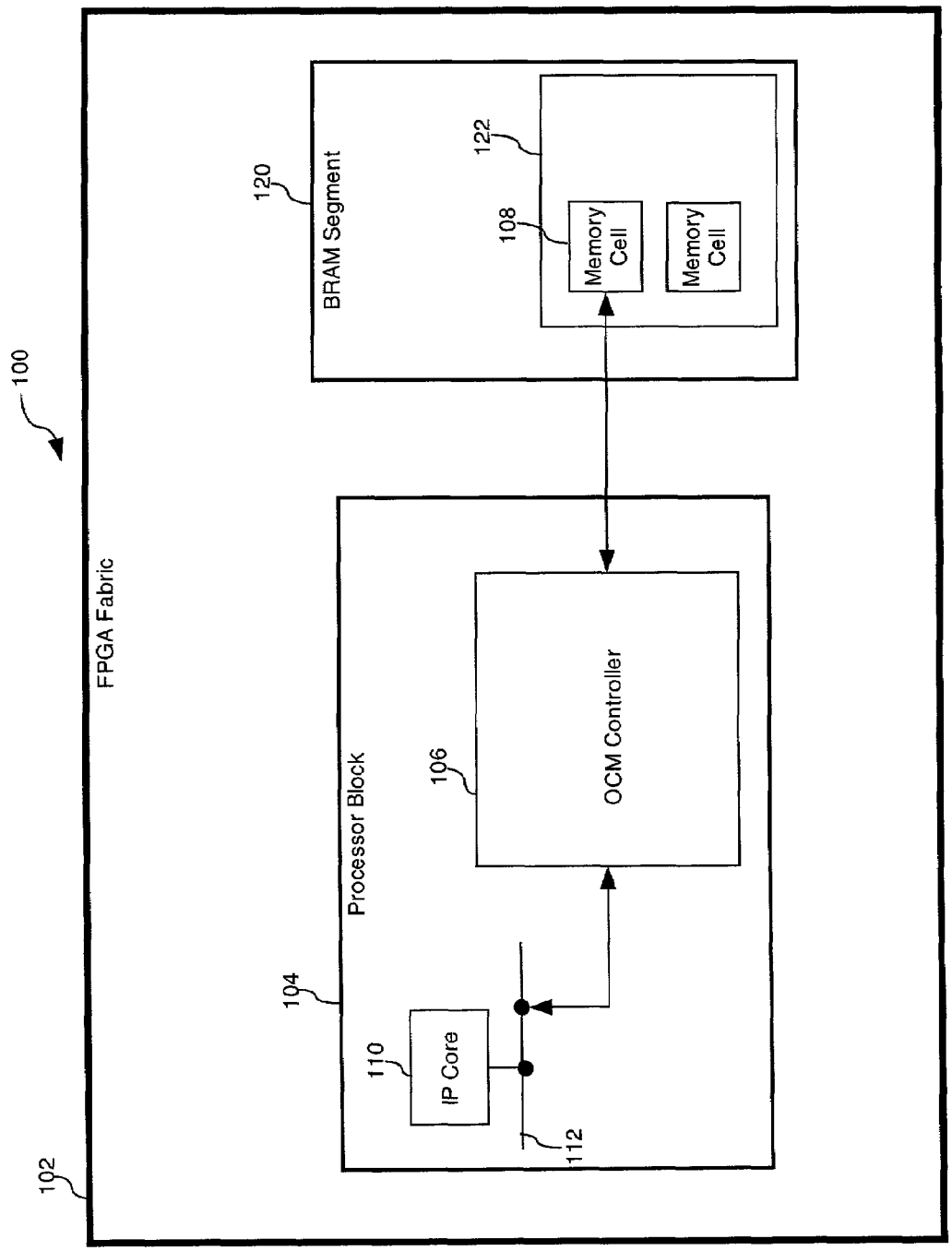
FIG. 1 is a block diagram of an exemplary FPGA-based system.

Referring to FIG. 1, there is shown a block diagram of an exemplary FPGA-based system 100. Referring to FIG. 1, the FPGA-based system 100 includes the FPGA fabric 102. The FPGA fabric 102 can include a processor block 104 and a BRAM segment 120. The BRAM segment 120 can include one or more BRAMS, each BRAM comprised of a plurality of memory cells. Memory cell 108 is a representative memory cell of a BRAM 122 within BRAM segment 120. However, the invention is not limited in this regard and there can be one or more BRAM segments within the FPGA Fabric 102 or other memory configurations.

The processor block 104 can include an IP core 110 and an on-chip memory (OCM) controller 106. Exemplary IP core 110 can include, but is not limited to, a microprocessor core or microcontroller core. The IP core 110 can be coupled to OCM controller 106 through a shared control bus 112. OCM controllers such as OCM controller 106 are known in the art. OCM controller 106 can be configured to control the communication of data between the BRAM segment 120 and the IP core 110.

Figure 2:
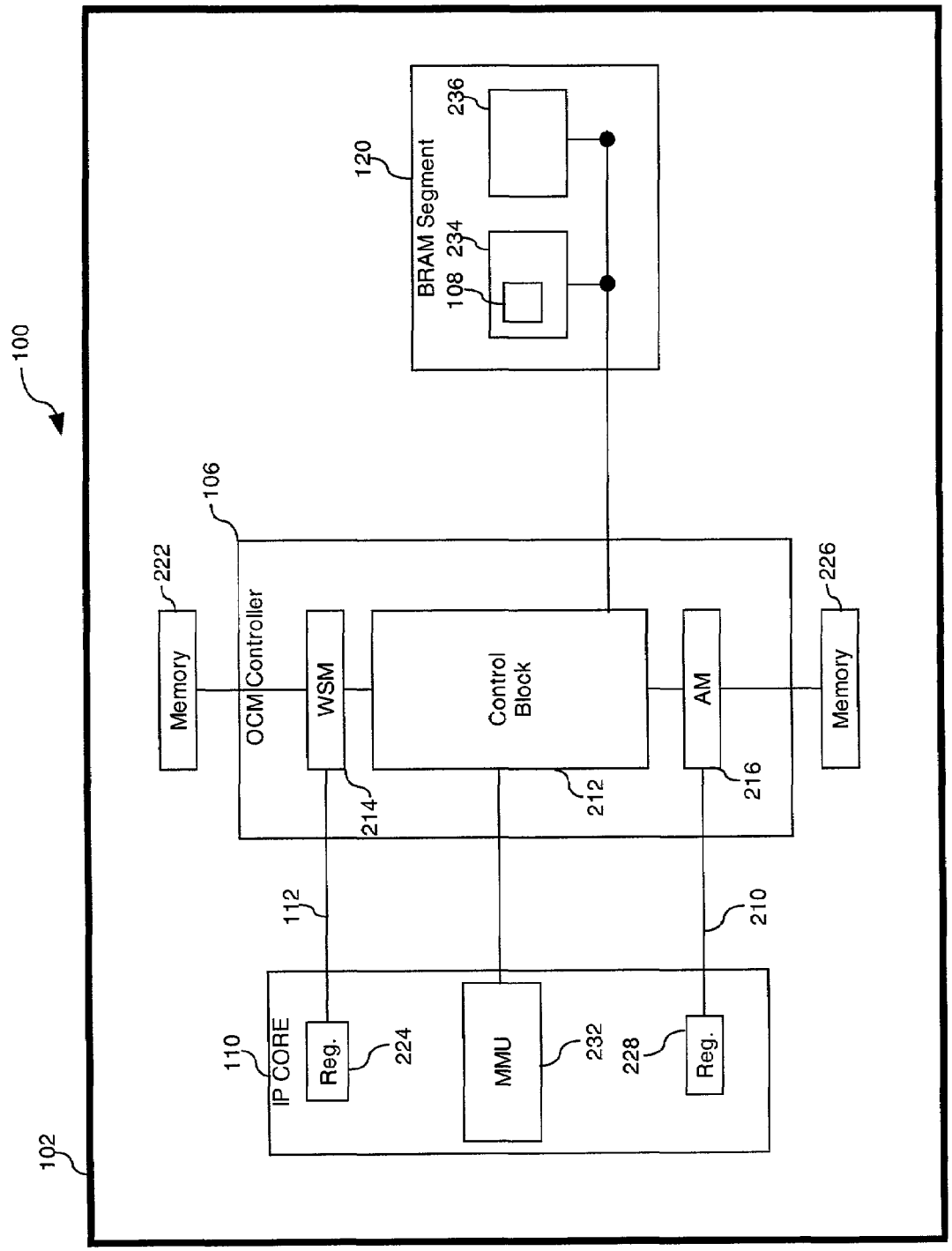
FIG. 2 is a block diagram of an exemplary OCM controller 106 in accordance with the FPGA-based system of FIG. 1.

FIG. 2 is a block diagram of the exemplary OCM controller 106 in accordance with the FPGA-based system of FIG. 1. Referring to FIG. 2, OCM controller 106 can include a control block 212, a wait state manager (WSM) 214, and an address manager (AM) 216. Control block 212 preferably interfaces with IP core 110 and BRAM segment 120. The wait state manager 214 can be configured to generate wait states used for operation of control block 212 in accordance with any combination of user and IP core 110 requirements. The address manager 216 can be configured to setup the address depth of the BRAM segment 120 in accordance with user requirements.

Wait state manager 214 can be configured to communicate with register 224 located within IP core 110, such communication preferably occurring via control bus 112. Additionally, the wait state manager 214 can be configured to communicate with memory 222 which can be part of processor block 104 (see FIG. 1) or BRAM segment 120. Notwithstanding, memory 222 may comprise one or more memory cells, depending on the amount of data to be stored therein. The size of register 224 can also depend on the number of wait states to be generated. The wait state manager 214 can also be configured to control the operation of control block 212 by directing control block 212 to generate wait states corresponding to the data contents of register 224 and/or memory 222.

Address manager 216 can be configured to accept inputs from register 228 located within IP core 110 via address bus 210. Additionally, the address manager 216 can be configured to communicate with memory 226, which can be part of processor block 104 (See FIG. 1) or the BRAM segment 120. Notwithstanding, memory 226 can include one or more memory cells, depending on the amount of data to be stored therein. In general, the size of register 226 can be dependent on the number of bits required to address the BRAM segment 120.

The address manager 216 can permit optimal access to BRAM segment 120. Particularly in a case where the BRAM 120 is divided into separate blocks, the address manager 216 can be permitted prioritized access to specified BRAM segments. For example, the BRAM can be divided into global BRAM and local BRAM. In this case, the address manager 216 can be configured to have prioritized access to either the local BRAM or the global BRAM to minimize access delay.

Control block 212 preferably interfaces with a memory management unit (MMU) 232 of IP core 110. The MMU 232 can be configured to generate read address signals for data load and instruction fetch operations. Additionally, MMU 232 can also be configured to generate write address signals for data to be written into memory. The MMU 232 can generate and receive appropriate control signals from control block 212 to facilitate certain operations. For example, control block 212 can accept read and write data bus signals from MMU 232. The control block 212 can further be configured to deliver read and write data signals to BRAMs 234 and 236, each BRAM preferably comprising one or more memory cells 108. Notwithstanding, it should be recognized that FIG. 2 is an exemplary block diagram and the invention in not limited in this regard. Pending U.S. patent application Ser. No. 09/917,30, Xilinx Inc., the assignee, entitled "User Configurable Memory System having Global Memory Blocks," provides a more exhaustive description of an exemplary OCM controller.

Figure 3:
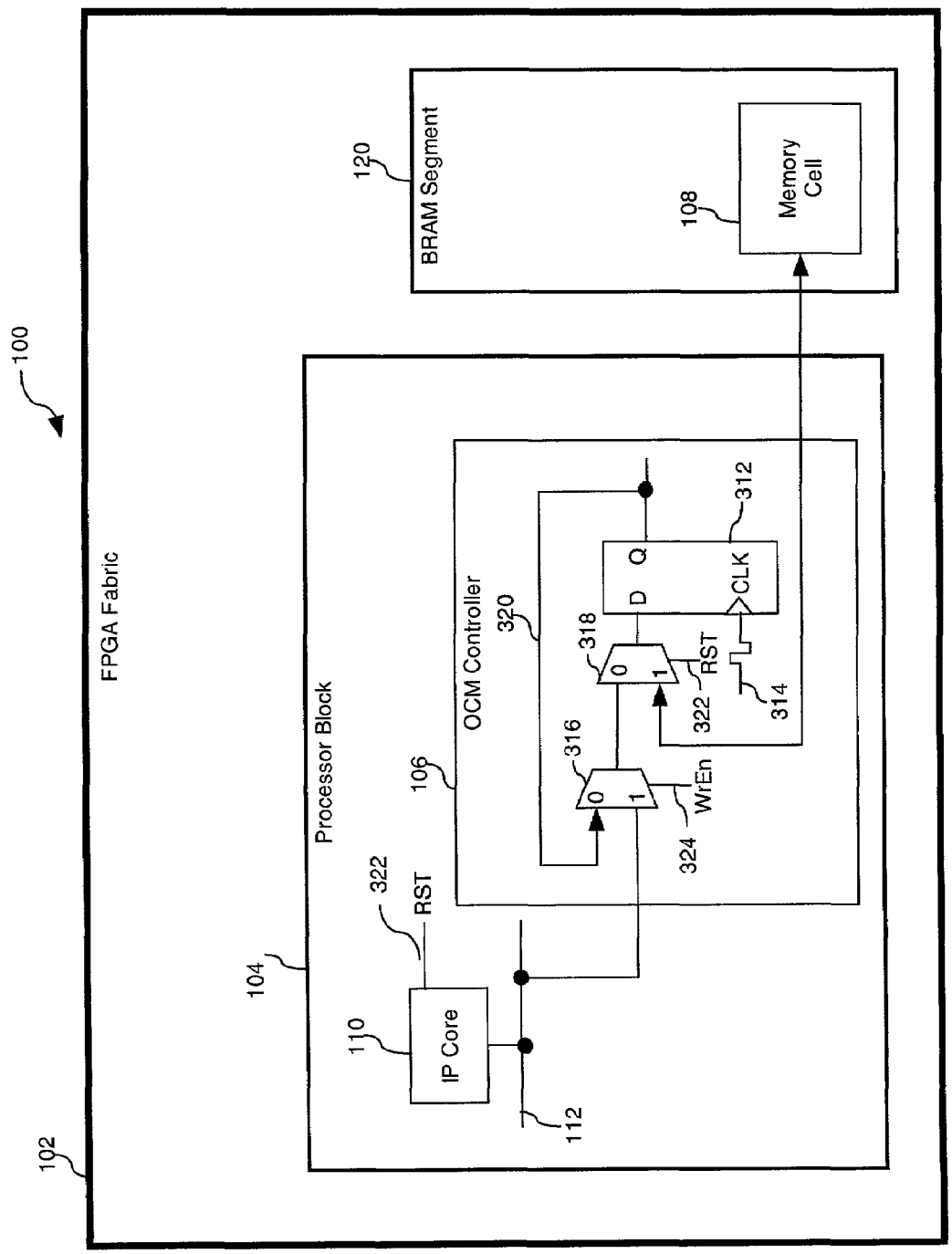
FIG. 3 is an exemplary block diagram of a system for controlling default values of flip-flops in accordance with the inventive arrangements.

FIG. 3 is an exemplary block diagram of a system for controlling default values of flip-flops in accordance with the inventive arrangements. A basic configuration register can be a single bit register capable of implementing a binary operation. In this regard, a simple 1-bit configuration register can be implemented by a single D type flip-flop (D-FF). Flip-flops are well known in the art and form the basic building blocks of most digital circuits and integrated circuits (IC). Advantageously, a single D-FF can be used as a configuration register to store a value for controlling the operation of OCM controller 106 prior to booting and for software controlled configuration of the FPGA 102. The sequence of events for FPGA start up comprises the powering up of the FPGA, a reset signal-being asserted, the FPGA being configured, the reset signal being de-asserted (when the configuration is complete), and the loading of boot or startup software. Thus, configuration of the FPGA occurs during a reset phase as will become more apparent in the description below.

Referring to FIG. 3, the OCM controller 106 can include a D-FF 312, and multiplexers 316 and 318. The D-FF 312 comprises inputs "D" and clock (CLK) signal 314. The D input of the D-FF 312 can be connected to a particular memory cell of BRAM segment 120. Upon FPGA 102 being powered and during reset phase, in advance of FPGA 102 being configured by boot or startup software, a pre-stored value in memory cell 108 can be loaded into the D-FF 312. The loading of the pre-stored value from the memory cell 108 into the D-FF 312 can occur on the transition of the CLK signal 314, since D-FF is an edge triggered device. Additionally, to accomplish loading of the D-FF 312 with the value from the memory cell 108, the reset (RST) signal 322 on the multiplexer 318 is held high (1). When the reset phase is done, the RST signal 322 is set to low (0). At this point the D-FF 312 representing the 1-bit control register is loaded.

Since the output Q of the D-FF 312 follows the D input of D-FF 312, D-FF 312 will remain in its loaded state since the Q output of D-FF 312 is looped back through multiplexers 316 and 318 respectively, into the D input of D-FF 312. This ensures that the D-FF 312 retains its loaded value until the value is purposely changed. The OCM controller 106 can use the value loaded in the D-FF 312 to control its operation prior to being initialized by any system or device software. Although an edge triggered D-FF is illustrated, the invention is not limited in this regard. Furthermore, the negated Q output of the D-FF is not shown, since it is not relevant to the understanding and practice of the invention.

Subsequent to loading system software, the value loaded in the control register or 1-bit D-FF 312 can be overwritten by the system software or application. In this case, the IP core 110 under the control of system software or an application, can write to a device control register. This device control register can be memory mapped to the physical memory address of D-FF 312. Importantly, to overwrite the value in the D-FF 312, the write enable signal (WrEn) 324 of multiplexer 316 can be held high (1) by IP core 110 via bus 112. Although the needed signals for asserting WrEn 324 come via bus 112, decoding logic (not shown) in OCM Controller 106 can be used to decode those needed signals to assert WrEn 324. Subsequent to loading D-FF 312, the WrEn 324 can be held low (0). Importantly, loop back path 320 ensures that once data stored in D-FF 312, the value will remain in the D-FF 312 until the RST signal 322 or the WrEn signal 324 is pulled high (1).

Although a single D-FF 312 is used to implement a simple configuration register in FIG. 3, it should be recognized by those skilled in the art that the invention is not limited in this regard. A plurality of D-FFs similar to D-FF 312 can be arranged to form a control register of any required size. Such arrangements are well known in the art. For example, four D-FFs could be arranged to implement a 4-bit configuration register for the OCM controller 106. In operation, the 4-bit configuration register can be used to inform the OCM controller 106 of the number of wait states required to access a particular device, for example BRAM 236 (FIG. 2). In this case, the 4-bit configuration can be used to represent any of 0 through 15 wait states. Similarly, the invention is not limited to configuration of an on-chip memory controller. In this regard, one or more flip-flops can be configured in accordance with the inventive arrangements to function as control register(s) for any FPGA on-chip device.

In light of the foregoing description of the invention, it should be recognized that the present invention can be realized in hardware, software, or a combination of hardware and software. A method and system for controlling default values of flip-flops in PGA/ASIC-based designs such as FPGA-based embedded processor SoCs according to the present invention can be realized in a centralized fashion in one computer system, or in a distributed fashion where different elements are spread across several interconnected computer systems. Any kind of computer system, or other apparatus adapted for carrying out the methods described herein, is suited. A typical combination of hardware and software could be a general-purpose computer system with a computer program that, when being loaded and executed, controls the computer system such that it carries out the methods described herein.

The present invention can also be embedded in a computer program product, which comprises all the features enabling the implementation of the methods described herein, and which, when loaded in a computer system, is able to carry out these methods. Computer program or application in the present context means any expression, in any language, code or notation, of a set of instructions intended to cause a system having an information processing capability to perform a particular function either directly or after either or both of the following a) conversion to another language, code or notation; b) reproduction in a different material form.

Additionally, the description above is intended by way of example only and is not intended to limit the present invention in any way, except as set forth in the following claims.

What is claimed is:

1. A method for pre-configuring an FPGA to a known state during a reset condition or prior to the FPGA undergoing system initialization, the method comprising:
   loading a configuration value for an on-chip device of the FPGA into a flip-flop interconnected to said on-chip device; and
   transferring said configuration value from said flip-flop to said on-chip device, said transfer of said configuration value effectuating pre-configuration of said on-chip device;
   wherein said flip-flop is a D-type flip-flop.

2. The method according to claim 1, further comprising pre-storing said configuration value in a memory cell of the FPGA.

3. The method according to claim 2, wherein said memory cell is a BRAM.

4. The method according to claim 2, further comprising transferring said configuration value from said memory cell to said flip-flop upon power-up of the FPGA.

5. The method according to claim 4, further comprising the supplying a clock signal to said flip-flop to effectuate said transfer of said configuration value from said memory cell to said flip-flop upon power-up of the FPGA.

6. The method according to claim 1, further comprising supplying a clock signal to said flip-flop to effectuate said transfer of said configuration value from said flip-flop to said on-chip device.

7. The method according to claim 1, wherein said flip-flop is a configuration register for said on-chip device.

8. The method according to claim 1, wherein said on-chip device is an on-chip memory controller.

9. A method for pre-configuring an FPGA during a reset condition or prior to system initialization of the FPGA, the method comprising:
  loading a value into at least one flip-flop of the FPGA, said at least one flip-flop functioning as a configuration register for an on-chip device of the FPGA; and
  configuring said FPGA on-chip device to a particular state using said loaded value from said at least one flip-flop;
  wherein said value is a bit.

10. The method according to claim 9, wherein said loading step further comprises:
  transferring said value stored in at least one memory cell of the FPGA to said flip-flop; and
  storing said transferred value in said at least one flip-flop of the FPGA.

11. The method according to claim 10, wherein said loading step further comprises the step of loading said transferred value into said at least one flip-flop whenever the FPGA is powered up.

12. The method according to claim 10, wherein the step of transferring further comprises storing said value for configuring said FPGA on-chip device in said at least one memory cell, said stored value representing a default state of said memory cell.

13. A system for pre-configuring an FPGA to a known state during a reset condition or prior to the FPGA undergoing system initialization, the system comprising:
  a flip-flop coupled to an on-chip device of the FPGA; and
  a clock transitioning circuit coupled to said flip-flop for causing;
    a configuration value for said FPGA on-chip device to be loaded into said flip-flop; and
    said configuration value to be read by said on-chip device, said reading of said configuration value effectuating the pre-configuration of said on-chip device;
  wherein said flip-flop is a D-type flip-flop.

14. The system according to claim 13, further comprising an FPGA memory cell for pre-storing said configuration value.

15. The system according to claim 14, wherein said memory cell is a BRAM.

16. The system according to claim 13, wherein said flip-flop is a configuration register for said on-chip device.

17. The system according to claim 13, wherein said on-chip device is an on-chip memory controller.

* * * * *